(12) United States Patent
Lohia et al.

(10) Patent No.: US 9,219,019 B2
(45) Date of Patent: Dec. 22, 2015

(54) PACKAGED SEMICONDUCTOR DEVICES HAVING SOLDERABLE LEAD SURFACES EXPOSED BY GROOVES IN PACKAGE COMPOUND

(71) Applicant: Texas Instruments Incorporated, Dallas, TX (US)

(72) Inventors: Alok Kumar Lohia, Dallas, TX (US); Reynaldo Corpuz Javier, Plano, TX (US); Andy Quang Tran, Grand Prairie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/215,896

(22) Filed: Mar. 17, 2014

(65) Prior Publication Data

US 2015/0262903 A1 Sep. 17, 2015

(51) Int. Cl.

| | |
|---|---|
| H01L 23/495 | (2006.01) |
| H01L 23/31 | (2006.01) |
| H01L 23/498 | (2006.01) |
| H01L 21/56 | (2006.01) |
| H01L 21/48 | (2006.01) |
| H01L 21/78 | (2006.01) |

(52) U.S. Cl.
CPC ........ *H01L 23/3107* (2013.01); *H01L 21/4842* (2013.01); *H01L 21/56* (2013.01); *H01L 21/78* (2013.01); *H01L 23/49503* (2013.01); *H01L 23/49541* (2013.01); *H01L 23/49565* (2013.01); *H01L 23/49838* (2013.01)

(58) Field of Classification Search
USPC ........................................................ 257/676
See application file for complete search history.

(56) References Cited

U.S. PATENT DOCUMENTS

| | | | |
|---|---|---|---|
| 2005/0003586 A1* | 1/2005 | Shimanuki et al. | 438/124 |
| 2010/0197116 A1* | 8/2010 | Shah et al. | 438/463 |

* cited by examiner

*Primary Examiner* — Shaun Campbell
(74) *Attorney, Agent, or Firm* — Steven A. Shaw; Frank D. Cimino

(57) ABSTRACT

A semiconductor device has a leadframe with a pad and a row of elongated leads with a solderable surfaces in a common plane; a package encapsulating the leadframe with an assembled semiconductor device, leaving the common-plane lead surfaces un-encapsulated and coplanar with the package material between adjacent leads, the row of aligned leads positioned along a package edge; and grooves in the package material cut in the common-plane surface, the grooves extend along a portion of each lead length, have a width and a depth about twice the width, and expose solderable lead surfaces.

5 Claims, 3 Drawing Sheets

PACKAGED SEMICONDUCTOR DEVICES HAVING SOLDERABLE LEAD SURFACES EXPOSED BY GROOVES IN PACKAGE COMPOUND

FIELD

The present invention is related in general to the field of semiconductor devices and processes, and more specifically to the structure and fabrication method of semiconductor devices with QFN leadframes having the leads positioned in slotted packaging compound.

DESCRIPTION OF RELATED ART

The structure of contact pad metallizations and solder bumps for connecting integrated circuit (IC) chips to semiconductor packages or outside parts, as well as the thermomechanical stresses and reliability risks involved, have been described in a series of detailed publications, especially by IBM researchers (1969). During and after assembly of the IC chip to an outside part by solder reflow and then during device operation, significant temperature differences and temperature cycles appear between semiconductor chip and the substrate. The reliability of the solder joint is strongly influenced by the coefficients of thermal expansion of the semiconductor material and the substrate material. For example, there is more than one order of magnitude difference between the coefficients of thermal expansion of silicon and FR-4 and laminated boards. This difference causes thermomechanical stresses, which the solder joints have to absorb. Detailed calculations involving the optimum height and volume of the solder connection and the expected onset of fatigue and cracking proposed a number of solder design solutions.

The fabrication methods and reliability problems involving flip-chips re-appear in somewhat modified form for ball-grid array type packages and chip-scale and chip-size packages, which may be attached directly to a printed circuit board (PCB), or alternatively, coupled to a second interconnection surface such as an interposer. Attaching the ball grid array to the next interconnect is carried out by aligning the solder bumps or balls on the package to contact pads on the interconnection and then performing a solder reflow operation. During the reflow, the bumps or balls liquefy and make a bond to the next interconnect level which has pads or traces to receive the solder. Following the solder reflow step, a polymeric underfill is often used between the package and the interposer (or PCB) to alleviate mechanical stress caused by the mismatch in the coefficients of thermal expansion (CTE) between the package, the interposer, if any, and the PCB. Many reliability problems occur due to the stress placed on the solder bumps or balls when the assembly is cycled from hot to cool during operation.

In one method of drastically reducing the thermomechanical stress on the solder bumps, a sheet-like compliant elastomer substantially de-couples the solder bumps, affixed to the outside PCB, from the IC chip and the interposer, thus relieving the thermal mismatch. Drawbacks of this method are assembly hurdles and cost considerations. Another method aims at absorbing part of the thermomechanical stress on the solder joints by plastic material surrounding the joints and filling the gap between chip and substrate. However, the underfilling method represents an unwelcome process step after device attachment to the motherboard.

In yet another wafer-level process, a flux-impregnated epoxy is screened on the wafer, with openings for the chip contact pads. The solder balls are placed on the pads; during the reflow process, the epoxy softens and forms a fillet, or collar, at the base of the solder ball, where stress-induced cracks typically originate. The wafer-level process with the required high temperature of solder reflow cannot be transferred to individual plastic packages.

The thermomechanical stress problems experienced at solder joints in ball-grid array devices re-appear in devices, which use QFN/SON-type leadframes. The name of these leadframes (Quad Flat No-lead, Small Outline No-lead) indicates that the leads do not have cantilevered leads, but flat leads, which are typically arrayed along the periphery of the packaged device. The metal of the leads is connected by solder material to the metal of respective contact pads of the external part. Even when the solder joints are not formed by solder balls but rather by solder layers, the nature of the thermomechanical stress at the joints derives from the mismatch of the coefficients of thermal expansion among the various materials. When plastic-packaged semiconductor devices with QFN/SON-type leadframes, attached to externals parts by solder balls or solder layers, are subjected to accelerating reliability tests such as temperature cycling, it is known that units may fail due to stress-induced microcracks through the solder joints. The stress originates from the differences of the coefficients of thermal expansion between the devices and external parts such as printed circuit boards.

In a recent effort to mitigate stress and reduce microcracks in solder joints, it was proposed to manufacture leadframes with grooves in those lead surfaces, which were intended to face externals boards at the time of solder attachment. After assembling chips on the pads of a leadframe strip and tying the chips to the leads, the strip is encapsulated in a packaging compound, leaving the grooves un-encapsulated. The grooves are then filled with solder. Thereafter, the strip is singulated by a sawing technique. At the time of solder attachment, the solder in the grooves was expected to reflow and mix with the new solder, forming an enlarged solder joint.

SUMMARY

Applicants' failure analysis of the microcracks in solder joints of semiconductor devices with QFN/SON-type leadframes revealed that solder cracks typically originate in the region of high stress concentration in conjunction with small metal burrs created in the sawing step of the singulation processes of molded semiconductor packages. The sawing step after the packaging process uses rotating saws to form discrete devices from leadframe strips by sawing through the plastic compound and the metallic connecting between adjacent devices, fraying the metal into occasional burrs. In addition, applicants found that the burrs frequently hinder the formation of a smooth solder meniscus at the freshly exposed lead sidewalls, thereby depriving the nascent solder joint of strong fillets needed to create robust joints, which can withstand the high thermomechanical stresses during device operation and reliability tests.

Applicants solved the problem of enabling robust solder meniscus and preventing solder necking, when they discovered a method of creating more solderable area per lead of a leadframe without enlarging the footprint of the leads by opening up a lead surface in the third dimension for attachment by solder. The preferred method employs a modified pulsed laser assisted micromilling technique related to the one described by T. Oesel and F. Pfefferkorn in 2007, which can create grooves in a plastic compound. Applicants modified this technique to apply it to plastic packaged semiconductor devices with QFN/SON-type leadframes metallurgically prepared with solderable surfaces, for instance by plating consecutive layers of nickel, palladium, and gold on the base metal surfaces. After assembling semiconductor chips on a leadframe strip, the strip is encapsulated in a polymeric molding compound containing inorganic fillers and then singulated by a sawing technique. Thereafter, the micromilling technique cuts grooves into the compound alongside the un-encapsulated surfaces of the metallic leads, exposing portions of the solderable lead sidewalls. These sidewalls are then accessible to liquefied solder so that they can be added to the solder joints, which are going to be formed at the leads during device attachment to an external part such as a printed circuit board. In order to prevent shortening between adjacent grooves, the micromilling technique has to retain compound ridges between adjacent leads, where the ridges have crests coplanar with the lead surfaces. Since the grooves are cut into the package compound after the sawing operation of the singulation step, the grooves are free of burrs and the related risk of solder necking and microcrack formation.

Alternative techniques for removing molding compound from lead sidewalls and creating trenches in adjacent package material include ablation and sputtering.

Another exemplary alternative method adds inserts into the chamber of the mold, which have been machined in accordance to the device type-to-be-molded, in order to hold away molding compound from a portion of the solderable lead surface in the third dimension.

DETAILED DESCRIPTION OF THE PREFERRED EMBODIMENTS

Figure 1A:
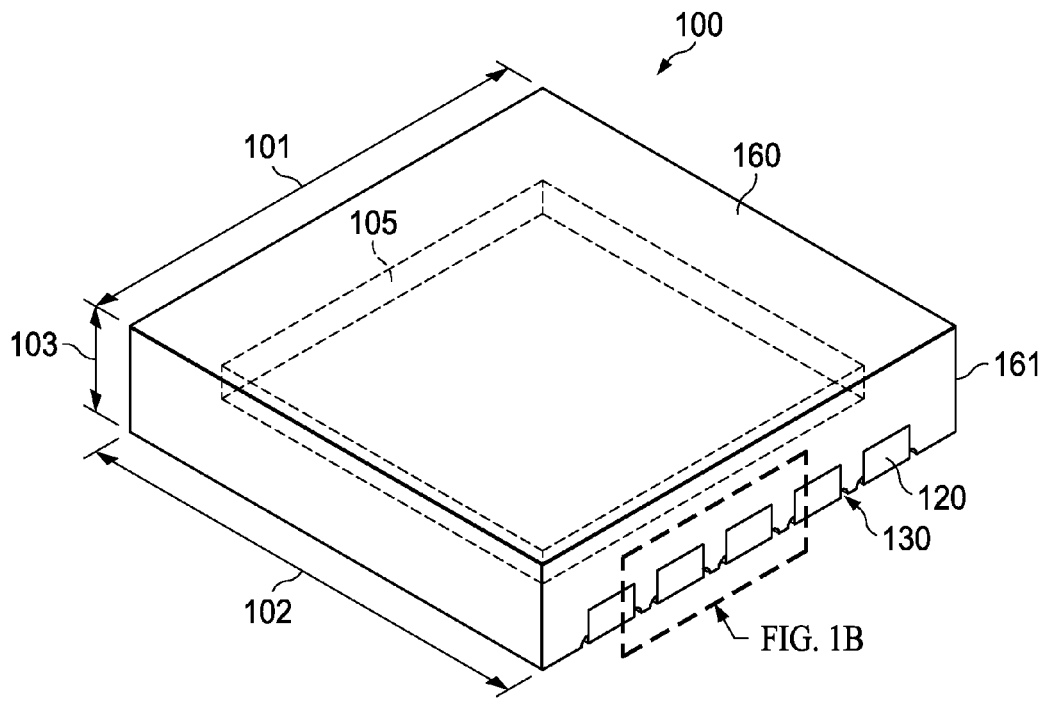
FIG. 1A shows a top perspective view of a packaged semiconductor device with QFN/SON-type leadframe and grooves in the packaging compound along a portion of the leads.
Figure 1B:
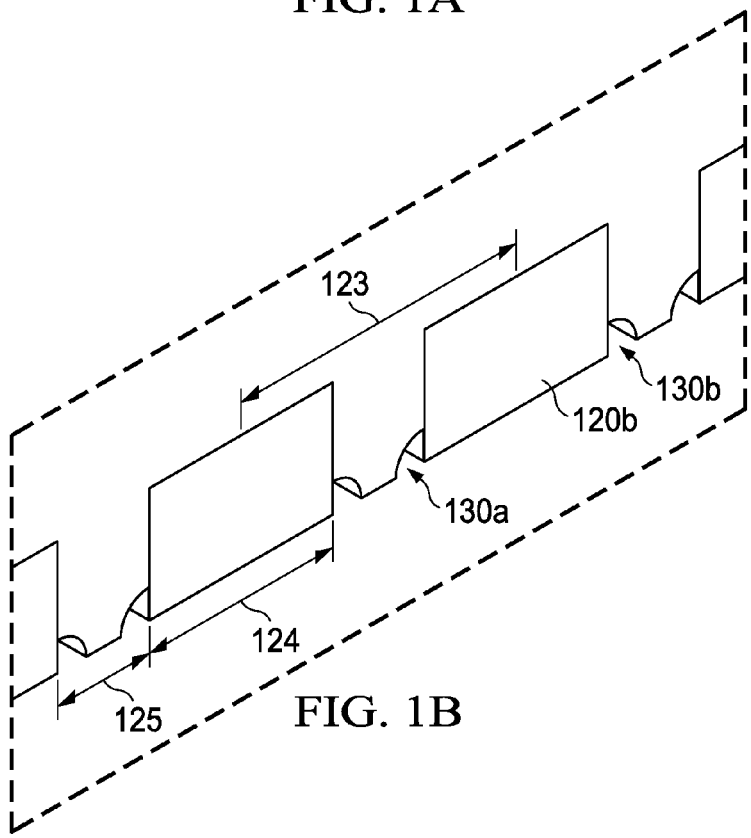
FIG. 1B is an enlargement of a portion of FIG. 1A.
Figure 2A:
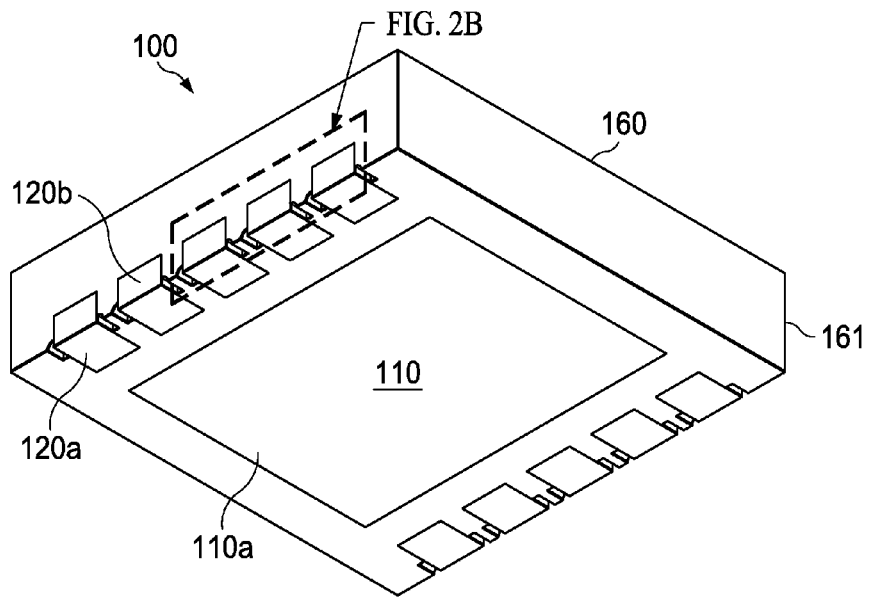
FIG. 2A illustrates a bottom perspective view of the device of FIG. 1 with grooves in the molding compound along the sides of each lead.
Figure 2B:
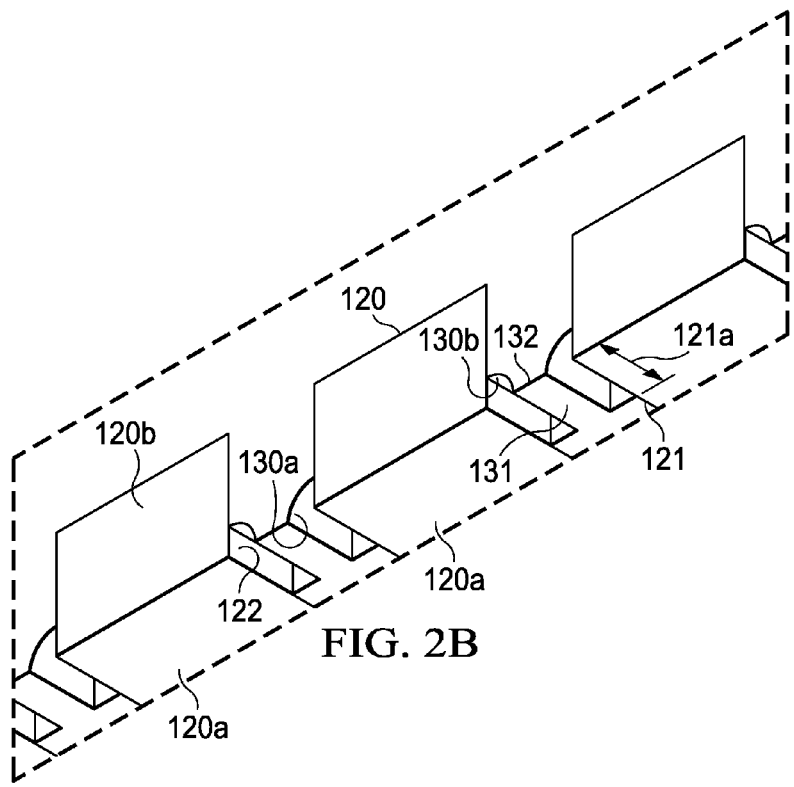
FIG. 2B is an enlargement of a portion of FIG. 2A.

In a perspective top view, FIG. 1A illustrates an exemplary embodiment of the invention, a packaged semiconductor device 100 with a leadframe of the Quad Flat No-Lead (QFN), Small Outline No-Lead (SON) design families. In FIG. 2A, the same device is shown in perspective bottom view. In other embodiments, the leadframes may include other types of configurations. Exemplary device 100 has a length 101 of about 3 mm, a width 102 of about 3 mm, and a height 103 of about 1 mm. Alternatively, other devices may have a multitude of geometries, both with regard to sizes and ratios of the geometries. The packages of preferred embodiments are shaped as a hexahedron; other embodiments may have rectangular or triangular cross sections.

The exemplary leadframe includes a pad 110 and a plurality of leads 120. In a generalized sense, the leads may be referred to as terminals. The pitch 123 of the leads is 0.5 mm, the width 124 of the leads is about 0.24 mm, and the width 125 of the intermittent package compound is about 0.26 mm. While devices with QFN/SON-type leadframes have typically at least one set of leads 120 in a row, FIG. 2A indicates that the leadframe of exemplary device 100 has two sets of leads aligned in a row. Alternatively, other devices may have three or four sets of leads in a row, and sometimes additional un-aligned leads. The leadframe base metal is preferably made of copper or a copper alloy. One or more surfaces of the leadframe may be metallurgically prepared to facilitate solder attachment, for instance by one or more layers of nickel, palladium, and gold sequentially plated onto the base metal.

Attached to leadframe pad 102 is a semiconductor chip (represented by 105 in FIG. 1A), which has terminals connected by bonding wires to the leads 120. The leadframe with the assembled chip and wires are encapsulated by a package 160, which preferably employs a package material including an epoxy-based polymeric compound suitable for transfer molding processes; the compound includes inorganic fillers. The package material is shaped by sidewalls 161 so that preferably device 100 is packaged in a housing with hexahedron shape; the cross section of such package is a rectangle or square. The one or more sets of leads aligned in rows are positioned along the edges of the package sidewalls. Alternatively, for other semiconductor devices the package may sidewalls with a cross section in the shape of a triangle.

The sheet of metal used for fabricating the leadframe is preferably planar. Consequently, surface 110a of pad 110 and lead surface 120a of leads 120 are in a common plane. The package side in the common plane is sometimes referred to as second side, while package sidewalls normal to the common plane are referred to as first sides. Lead surfaces in the common plane remain un-encapsulated by package 160. The exemplary embodiment of FIG. 1A and FIG. 2A has leads 120 positioned along edges of package 160.

As stated above, the preferred base metal of the leadframe includes copper; alternative metals include aluminum, iron-nickel alloys, and Kovar. Preferred thickness of the leadframe base metal for the exemplary embodiment shown in FIG. 1A and FIG. 2A is in the range from 0.2 mm to 0.3 mm; other embodiments may use thicker or thinner leadframe metal. From the standpoint of low cost and batch processing, it is preferred to start with sheet metal and fabricate the leadframe as a strip by stamping or etching. As a consequence of the fact that the starting material is a sheet metal, leadframe pad 110, leads 120 are in a common plane. It is preferred to flood-plate the stamped leadframe with one or more layers of metals, which promote solder adhesion, such as nickel and palladium. A preferred metallurgy for good solder adhesion is a layer of nickel followed by a layer of palladium followed by an outermost layer of gold. Alternatively, a layer of tin may be plated. The solderable surface is exposed in surfaces 110a and 120a. In addition, for some devices at least one surface may have a metal layer deposited to enhance thermal conductivity, for instance by a plated layer of silver. Discrete devices are singulated from the leadframe strip by a rotating saw or a trimming machine after the encapsulation process. Had the leadframe been designed with leads having a groove in the outside surface, and the groove been filled with solder after the encapsulation step, care has to be taken that burrs caused by the sawing process do not damage the solder fillings.

Due to the plated metal layers, lead surface 120a is solderable. On the other hand, lead surface 120b, created by the sawing process, displays the leadframe base metal such as copper, and may thus have only weak affinity for solder wetting. If it were only for those two surfaces, reliable solder fillets would mainly be formed at surfaces 120a so that the resulting fillets could be afflicted by necking and constrictions, which may have a tendency for developing microcracks under stress concentrations. The solution to this problem are the grooves illustrated in FIGS. 1A, 1B, 2A and 2B, which free up additional solderable lead surface in the third dimension, thus not enlarging the solder joint footprint.

As FIGS. 1A, 1B, 2A, and 2B show, each lead in a row of leads has grooves 130a and 130b in the package material at the edges of the common plane and a package sidewall. The grooves (130a, 130b) are cut on both sides of a lead 120 in the common plane surface, while leaving package material between adjacent grooves as ridges 131 with crests 132 coplanar with the lead surfaces 120a. The grooves extend along a portion 121a of each lead length 121 normal to the package edge and expose solderable lead surfaces 122. The additional solderable surface is normal to the common plane. When solder fillets are formed, it is a technical advantage that the solder, which is wetting the additional surface to form welded attachment, adds fillet volume in the third dimension relative to the solder volume attached to lead surfaces in the common plane. The additional solder attachment enforces the solder joint significantly and minimizes any risk of stress-induced solder fatigue and microcracks.

Dependent on the device type, the length of the leads and the thickness of the leadframe base metal, the portion 121a of a lead length 121 may be selected to extend from only a fraction of the length 121 up to about half of the length. In all cases, the grooves need to leave reliable ridges between adjacent grooves to avoid shortening of adjacent solder fillets.

Another embodiment of the invention is a method for fabricating semiconductor devices with QFN/SON-type leadframes, which have leads with grooves or slots in the packaging compound. The preferred method is a modification and adjustment of a technique published by Tugrul Özel, Rutgers University, Piscataway, N.J., and Frank Pfefferkorn, University of Wisconsin, Madison, Wis., entitled "Pulsed Laser Assisted Micromilling for Die/Mold Manufacturing", in Proceedings of ASME 2007 International Manufacturing Science and Engineering Conference, Atlanta, Ga., October 2007, pp. 337-342.

Alternative techniques for removing molding compound from lead sidewalls and creating trenches in adjacent package material include ablation and sputtering.

Another exemplary alternative method adds inserts into the chamber of the mold, which have been machined in accordance to the device type-to-be-molded, in order to hold away molding compound from a portion of the solderable lead surface in the third dimension.

Molding compounds for semiconductor devices include an epoxy-based polymeric material, which is filled with a high percentage of inorganic fillers to lower the coefficient of thermal expansion and to enhance mechanical stability. After hardening the compound by polymerization, the materials are difficult to process. With the help of a focused laser beam, a small area of the package can be preheated in order to thermally soften it for a removal action of a micro-mechanical drill. While the drill rotates like a spindle, it moves laterally to cut away material and clears a path through the softened material. By pulsing the laser beam, the heat-affected zone can be kept narrow. After placing the device package on a three-dimensionally movable table, the package can be raised and lowered, and moved in x- and y-direction under the laser and the spindle so that a path can be cut into the polymerized package material. The high-speed drill follows the pulsed laser without delay. The process is referred to as micro-milling. Due to the induced heat by the pulsed laser, the polymeric compound removal rate is high and thus economical for mass production.

For micro-milling semiconductor packages with sub-micron tolerance (0.3 µm), precision machine tools for example from KERN Micro- and Feinwerktechnik, Germany, are commercially available, for instance in combination with CIMATRON micro-milling software and CAD/CAM solutions. As an example, the speed of the spindle may be >50,000 rev./min, but greater or smaller speeds may be suitable. Among the pulsed lasers, microsecond pulsed Nd:Yag lasers are preferred for the exemplary device shown, since their peak power provides local preheating to soften the package material without melting and ablation. For devices with smaller geometries or more numerous leads, nanosecond pulsed lasers may be considered. These short-pulsed lasers allow the production of clean grooves with small heat-affected zones and little debris. A computer coordinates the laser system and the x-, y-, z-movements of the table, which holds the device, in order to translate the device under the focused laser spot and the micro-milling cutter.

Figure 3:
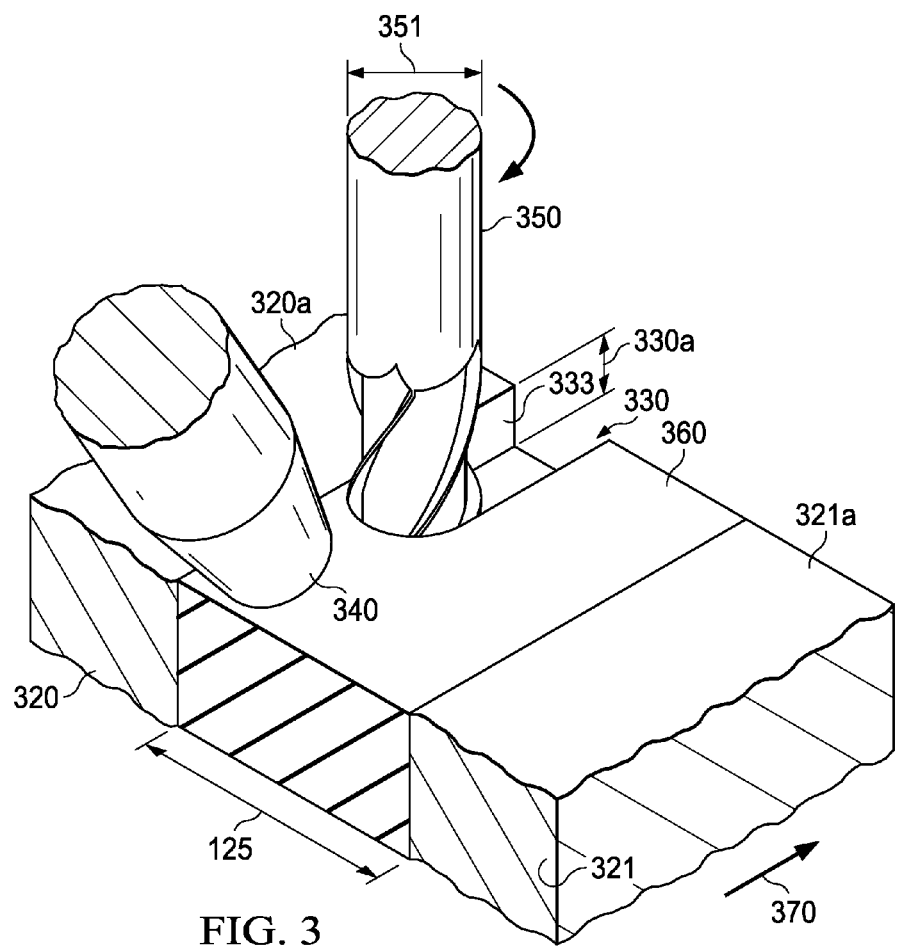
FIG. 3 illustrates a portion of the apparatus for creating the grooves in the molding compound using a pulsed laser-assisted micromilling technique (after T. Özel and F. Pfefferkorn, ASME, 2007).

FIG. 3 (after T. Özel and F. Pfefferkorn, ASME, 2007) illustrates schematically the process of micro-milling to create grooves along the length of metallic leads. The figure shows a portion of an exemplary device package under focused laser beam 340 and rotating micro drill 350; the diameter 351 of the drill is about 50 µm. Since the device is on a movable table, the package can move in direction 370; it also can move in the vertical dimension. FIG. 3 shows a portion of package material 360 between leads 320 and 321 of the leadframe of the exemplary device; the width 125 of the package material is about 260 µm. A pulse of the focused laser beam 340 preheats a spot of the package material, while the rotating micro drill 350 follows the laser closely, steadily cutting away material and opening an elongated groove 330 while the device moves laterally. In FIG. 3, rotating spindle 350 has just cleared a portion 330, which is a fraction of the lead length 121; the depth 330a of the groove or slot is about 100 µm. For some devices, this groove may be sufficient; for other devices the clearing process may be continued until the groove stretches about halfway along the lead length.

The lead surfaces 320a and 321a are in a common plane and have a metallurgical configuration with high affinity for solder. As mentioned above, it is preferred that all lead surfaces are solderable, for instance by flood plating the leadframe after stamping with a sequence of layers including nickel, palladium, and gold. Alternatively, a layer of tin may be plated. Consequently, in this case the freshly exposed lead surface 333 is also solderable and can thus be added to support a robust solder joint. If any of the solderable surfaces 333 should be damaged during the removal process, one or more of the metal plating steps may be repeated (analogous to the post-molding plating processes).

The process flow of fabricating a packaged semiconductor device with QFN/SON-type leads adjoined by grooves in the package compound starts by providing a metallic QFN/SON-type leadframe strip, which includes a plurality of device sites. Each site includes an assembly pad and a plurality of elongated leads with solderable surfaces. At least one set of leads is aligned in a row while having a surface in a common plane; the rows of adjacent sites are connected by rails. The surfaces of the leadframe are metallurgically prepared to be solderable. A preferred preparation includes the sequential plating of metal layer on the leadframe base metal, starting with a nickel layer, followed by a palladium layer, and an outermost (but optional) gold layer.

In the next process step, a semiconductor device is assembled on each pad and connected to respective leads; a preferred connection method is wire bonding. Next, the strip with the assemblies is encapsulated in a packaging material, preferably by a molding process in an epoxy-based polymeric compound filled with inorganic particles. The encapsulation leaves the lead surfaces in the common plane un-encapsulated and coplanar with the package material between adjacent leads.

In the next process step, packaged devices are singulated from the strip by sawing through the packaging material and the connecting rails between rows of leads. By this process step, discrete devices are created, which are encapsulated in packages and have the rows of aligned leads positioned along package edges. Any metal burrs incidentally created by the sawing process are inconsequential, since they cannot influence the formation of solder fillets.

A modified pulsed laser-assisted micro-milling technique is used to form grooves in the package material between adjacent leads by cutting into the common-plane surface. The grooves are contiguous to the lead metal and stretch along a portion of the length of the leads. Thereby, the grooves expose solderable lead surface, which is available during the board solder attachment process to be added to solder wetting and welding. Between pairs of adjacent grooves, ridges of package material are left, which have crests coplanar with the lead surfaces. As mentioned, the grooves extend along a portion of each lead length normal to the package edge and expose solderable lead surfaces.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the invention can be applied beyond the assembly of semiconductor devices to the solder attachment of any body with solderable metal terminals, which can be enhanced by forming oblong grooves parallel to the terminal. The grooves enlarge the contact area for the solder into the third dimension without enlarging the terminal footprint, and provide clear visibility of the solder fillet, possibly shaped as a meniscus; the visual inspection of the solder fillet thus enhances quality control.

It is therefore intended that the appended claims encompass any such modifications or embodiments.

We claim:
1. A semiconductor device package comprising:
    a metallic Quad Flat No-Lead/Small Outline No-Lead QFN/SON-type leadframe having a pad and a plurality of elongated leads with solderable surfaces, at least one set of leads aligned in a row while having a solderable surface in a common plane;
    a semiconductor device assembled on the pad and connected to the leads;
    a package encapsulating the assembly and the leadframe, leaving the common-plane lead surfaces un-encapsulated and coplanar with the package material between adjacent leads, the row of aligned leads positioned along a package edge; and
 grooves in the package material cut in the common-plane surface, the grooves extending along a portion of each lead length and exposing solderable lead surfaces, wherein the package material between adjacent grooves retains ridges having crests coplanar with the lead surfaces.

2. The package of claim 1 wherein the grooves extend from the package edge about half way along each lead length.

3. The package of claim 1 wherein the grooves are created by a material-removing method selected from a plurality including a pulsed laser-assisted micro-milling technique, an ablation technique, and a sputtering technique.

4. The package of claim 1 wherein the package is shaped as a hexahedron having sidewalls normal to the common plane.

5. The package of claim 4 wherein the row of aligned leads is positioned along a hexahedron edge formed by a package sidewall and the common plane.

* * * * *